(12) United States Patent
Hu

(10) Patent No.: US 7,917,780 B2  
(45) Date of Patent: Mar. 29, 2011

(54) MOTHERBOARD POWER ON CIRCUIT

(75) Inventor: Ke-You Hu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 579 days.

(21) Appl. No.: 12/056,257

(22) Filed: Mar. 26, 2008

(65) Prior Publication Data

US 2009/0231000 A1 Sep. 17, 2009

(30) Foreign Application Priority Data

Mar. 11, 2008 (CN) .......................... 2008 1 0300520

(51) Int. Cl.  
*G06F 1/26* (2006.01)

(52) U.S. Cl. ........................................ 713/300; 713/310
(58) Field of Classification Search .................. None
See application file for complete search history.

(56) References Cited

U.S. PATENT DOCUMENTS

| | | | |
|---|---|---|---|
| 2007/0153440 A1* | 7/2007 | Huang | 361/91.1 |
| 2008/0150592 A1* | 6/2008 | Liu | 327/142 |
| 2008/0170720 A1* | 7/2008 | Rashid | 381/94.5 |

* cited by examiner

*Primary Examiner* — Dennis M Butler  
(74) *Attorney, Agent, or Firm* — Frank R. Niranjan

(57) ABSTRACT

A motherboard power on circuit includes a switch connector, an impedance circuit, and a super I/O chip. The impedance circuit includes a first resistor, a second resistor, and a capacitor. A terminal of the first resistor is connected to the power on terminal of the switch connector. The other terminal of the first resistor is connected to the power on terminal of the super I/O chip, a terminal of the second resistor, and a terminal of the capacitor. The other terminals of the second resistor and the capacitor are connected to a power source and ground respectively.

5 Claims, 2 Drawing Sheets

MOTHERBOARD POWER ON CIRCUIT

BACKGROUND

1. Field of the Invention

The present invention relates to power on circuits, and particularly to a motherboard power on circuit.

2. Description of Related art

Normally, when a power button on a computer is pressed down, the computer is immediately powered up. But sometimes, the computer should be tested in a chamber at 40° C. and 80% relative humidity. In which case, a tester will have to hold the power button for longer than usual before the computer powers up. The reason is that the environmental change leads to the mismatching of impedance between a front panel switch connector of the computer and a super I/O chip of the computer.

What is needed, therefore, is a motherboard power on circuit which overcomes the above problems.

SUMMARY

A motherboard power on circuit includes a switch connector, an impedance circuit, and a super I/O chip. The impedance circuit includes a first resistor, a second resistor, and a capacitor. A terminal of the first resistor is connected to the power on terminal of the switch connector. The other terminal of the first resistor is connected to the power on pin of the super I/O chip, a terminal of the second resistor, and a terminal of the capacitor. The other terminals of the second resistor and the capacitor are connected to a power source and ground respectively.

Other advantages and novel features of the present invention will become more apparent from the following detailed description of an embodiment when taken in conjunction with the accompanying drawings.

DETAILED DESCRIPTION

Figure 1:
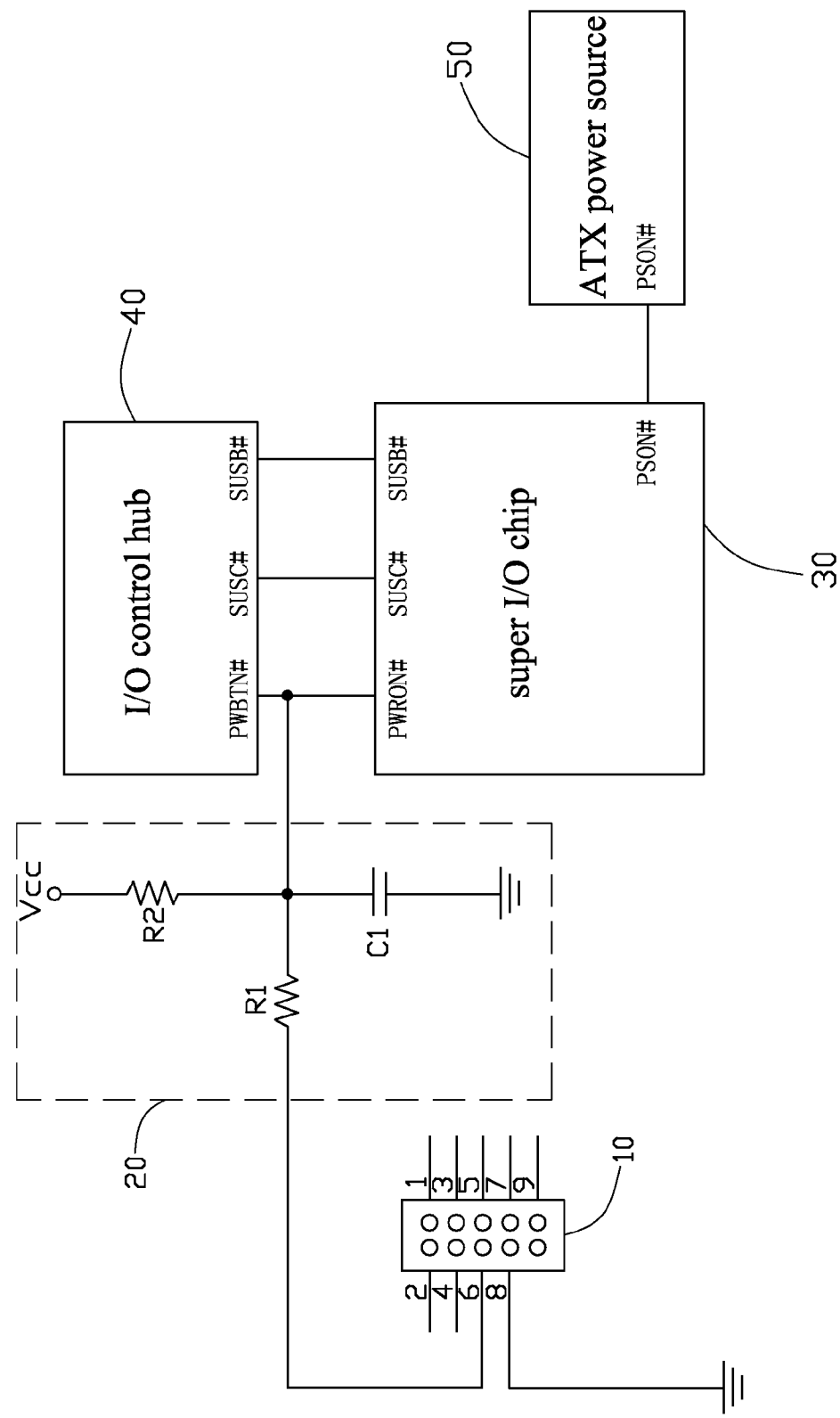
FIG. 1 is a circuit diagram of a motherboard power on circuit in accordance with an embodiment of the present invention.

Referring to FIG. 1, a motherboard power on circuit in accordance with an embodiment of the present invention includes a front panel switch connector 10, an impedance circuit 20, a super I/O chip 30, an I/O control hub 40, and an ATX power source 50. The impedance circuit 20 includes a first resistor R1, a second resistor R2, and a capacitor C1. The front panel switch connector 10 includes nine pins 1, 2, 3, 4, 5, 6, 7, 8, 9, and the pin 8 is connected to the ground. The pin 6 of the front panel switch connector 10 acting as the power on terminal is connected to a terminal of the first resistor R1. The other terminal of the first resistor R1 is connected to the power on terminal PWROH# of the super I/O chip 30, a terminal of the second resistor R2, and a terminal of the capacitor C1. The other terminal of the second resistor R2 is connected to a DC power source Vcc. The other terminal of the capacitor C1 is ground. The power on terminal PWROH#, the terminals SUSB# and SUSC# of the super I/O chip 30 are connected to the terminals PWBTN#, SUSB# and SUSC# of the I/O control hub 40 respectively. The terminal PSON# of the super I/O chip 30 is connected to the terminal PSON# of the ATX power source 50. In the present embodiment, the resistance of the first resistor R1 ranges from 30Ω to 33Ω, the resistance of the second resistor R2 ranges from 2.2 kΩ to 2.5 kΩ, and the capacitance of the capacitor C1 ranges from 1000 pF to 2 nF.

The pin 6 of the front panel switch connector 10 connects to the pin 8 when a computer power button is pushed down. The front panel switch connector 10 provides a power on signal for the motherboard power on circuit. The impedance circuit 20 provides a suitable impedance for the super I/O chip 30. The power on terminal PWRON# of the super I/O chip 30 timely receives the power on signal and sends it to the terminal PWBTN# of the I/O control hub 40. The I/O control hub 40 sends a control signal to the super I/O chip 30 through the terminal SUSB# and SUSC#. The terminal PSON# of the super I/O chip 30 controls the ATX power source 50 to supply power to the computer.

Figure 2:
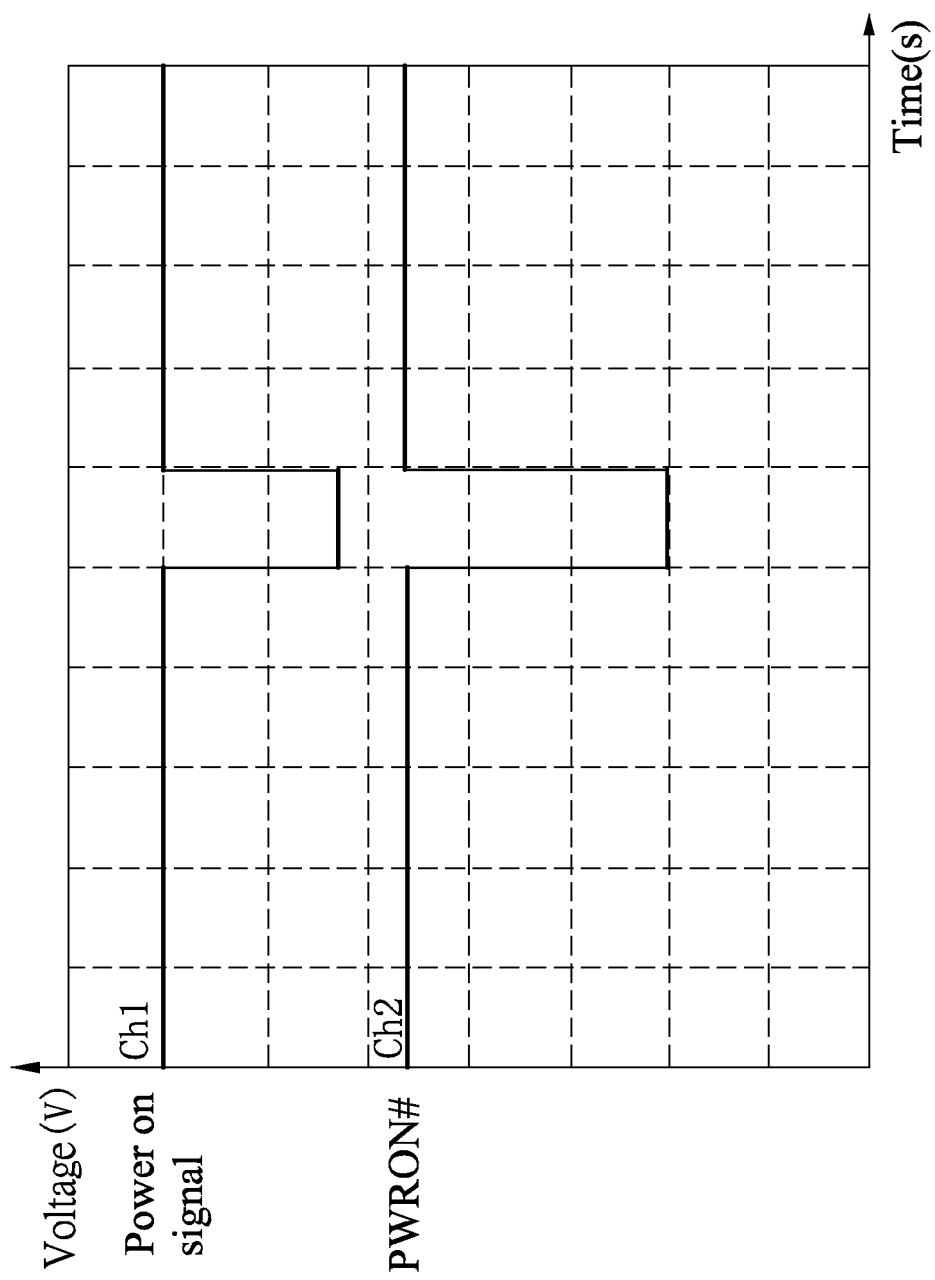
FIG. 2 is a comparative graph showing waveforms obtained at a switch connector and a super I/O chip of the motherboard of FIG. 1.

Referring to FIG. 2, the waveform of the power on signal output from the front panel switch connector 10, when the motherboard is placed in an environment at a temperature of 40° C. and 80% relative humidity, is displayed on channel 1 (Ch1) of an oscillograph, and the waveform of the power on signal received at the power on terminal PWRON# of the super I/O chip 30 is displayed on channel 2 (Ch2) of the oscillograph. As shown in FIG. 2, the super I/O chip 30 receives the power on signal without delay and enables the motherboard power on circuit to power up correctly.

Because the resistance of the first resistor R1 ranges from 30Ω to 33Ω, the resistance of the second resistor R2 ranges from 2.2 kΩ to 2.5 kΩ, and the capacitance of the capacitor C1 ranges from 1000 pF to 2 nF, the impedance circuit 20 is able to provide a suitable impedance for the super I/O chip 30 enabling the motherboard to function normally. In particular, when the resistance of the first resistor R1 is 33Ω, the resistance of the second resistor R2 is 2.2 kΩ, and the capacitance of the capacitor C1 is 1000 pF, the impedance circuit 20 provides the optimum impedance for the super I/O chip 30, and the power on terminal PWRON# of the super I/O chip 30 will receive the power on signal without delay.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A motherboard power on circuit comprising:
   a switch connector comprising a power on terminal;
   a super I/O chip comprising a power on terminal; and
   an impedance circuit comprising a first resistor, a second resistor, and a capacitor, a terminal of the first resistor connected to the power on terminal of the switch connector, the other terminal of the first resistor connected to the power on terminal of the super I/O chip, a terminal of the second resistor, and a terminal of the capacitor, the other terminals of the second resistor and the capacitor connected to a power source and ground respectively.

2. The motherboard power on circuit as claimed in claim 1, wherein the resistance of the first resistor ranges from 30Ω to 33Ω, the resistance of the second resistor ranges from 2.2 kΩ to 2.5 kΩ, and the capacitance of the capacitor ranges from 1000 pF to 2 nF.

3. The motherboard power on circuit as claimed in claim 2, wherein the resistance of the first resistor is 33Ω.

4. The motherboard power on circuit as claimed in claim 2, wherein the resistance of the second resistor is 2.2 kΩ.

5. The motherboard power on circuit as claimed in claim 2, wherein the capacitance of the capacitor is 1000 pF.

* * * * *